(12) United States Patent
Sundaramoorthy et al.

(10) Patent No.: US 9,039,279 B2
(45) Date of Patent: May 26, 2015

(54) SYSTEM AND METHOD FOR MONITORING IN REAL TIME THE OPERATING STATE OF AN IGBT DEVICE

(71) Applicant: ABB RESEARCH LTD, Zürich (CH)

(72) Inventors: Vinoth Sundaramoorthy, Baden-Daettwil (CH); Alexander Heinemann, Untersiggenthal (CH); Enea Bianda, Baden (CH); Franz Zurfluh, Brugg (CH); Gerold Knapp, Ehrendingen (CH); Iulian Nistor, Niederweningen (CH); Richard Bloch, Oberarth (CH)

(73) Assignee: ABB RESEARCH LTD, Zurich (CH)

( * ) Notice: Subject to any disclaimer, the term of this patent is extended or adjusted under 35 U.S.C. 154(b) by 372 days.

(21) Appl. No.: 13/739,742

(22) Filed: Jan. 11, 2013

(65) Prior Publication Data

US 2013/0177041 A1    Jul. 11, 2013

(30) Foreign Application Priority Data

Jan. 11, 2012  (EP) .................................... 12150704

(51) Int. Cl.
| | |
|---|---|
| G01K 7/00 | (2006.01) |
| H01L 21/66 | (2006.01) |
| G01K 7/01 | (2006.01) |
| G01R 31/26 | (2014.01) |
| H03K 17/18 | (2006.01) |
| H03K 17/08 | (2006.01) |

(52) U.S. Cl.
CPC ........ *H01L 22/30* (2013.01); *G01K 7/01* (2013.01); *G01R 31/2619* (2013.01); *G01R 31/2642* (2013.01); *H03K 17/18* (2013.01); *G01K 2217/00* (2013.01); *H03K 2017/0806* (2013.01)

(58) Field of Classification Search
USPC ................................................... 374/178, 170
See application file for complete search history.

(56) References Cited

U.S. PATENT DOCUMENTS

| 6,431,749 | B1 | 8/2002 | Tolant et al. | |
|---|---|---|---|---|
| 2009/0167414 | A1 | 7/2009 | Jansen | |
| 2014/0375362 | A1* | 12/2014 | Lobsiger et al. | ............. 327/109 |

FOREIGN PATENT DOCUMENTS

| EP | 0 336 814 A1 | 10/1989 |
|---|---|---|
| EP | 1 860 446 A1 | 11/2007 |

* cited by examiner

*Primary Examiner* — Mirellys Jagan
(74) *Attorney, Agent, or Firm* — Buchanan Ingersoll & Rooney PC

(57) ABSTRACT

A system and method are provided for monitoring in real time the operating state of an IGBT device, to determine a junction temperature and/or the remaining lifetime of an IGBT device. The system includes a differential unit configured to receive a gate-emitter voltage characteristic of the IGBT device to be measured and to differentiate the gate-emitter voltage characteristic to obtain pulses correlating with edges formed by a Miller plateau phase during a switch-off phase of the IGBT device. The system also includes a timer unit configured to measure the time delay between the obtained pulses indicating the start and end of the Miller plateau phase during the switch-off phase of the IGBT device, and a junction temperature calculation unit configured to determine at least one of the junction temperature of the IGBT device and/or the remaining lifetime of the IGBT device based on the measured time delay.

18 Claims, 4 Drawing Sheets

SYSTEM AND METHOD FOR MONITORING IN REAL TIME THE OPERATING STATE OF AN IGBT DEVICE

RELATED APPLICATION

This application claims priority under 35 U.S.C. §119 to European Patent Application No. 12150704.0 filed in Europe on Jan. 11, 2012, the entire content of which is hereby incorporated by reference in its entirety.

FIELD

The present disclosure relates to the field of insulated gate bipolar transistor (IGBT) devices. More particularly, the present disclosure relates to a system and method for measuring or estimating a junction temperature of an IGBT device.

BACKGROUND INFORMATION

The junction temperature of IGBT devices in semiconductor modules during operation in, for example, a power electronic converter, is an important parameter that provides information about the thermal stress the device is exposed to. Hence, it can be used to predict and evaluate the ageing of the IGBT device as well as the power module and to estimate the remaining lifetime of the IGBT device.

It is known for the junction temperature of an IGBT device to be measured using standard temperature measuring techniques, such as using an infrared camera probing, a thermal couple inside the IGBT device package directly at or next to the IGBT semiconductor, or measuring the internal gate resistance of the IGBT device in order to obtain an indication of the device temperature. These techniques either involve direct access to the IGBT device package or require specially designed IGBT devices.

Furthermore, the inner IGBT device temperature can be simulated by measuring the temperature of a base plate or substrate by means of a temperature sensor and applying a detailed thermal network describing the thermal interactions in the device. The simulation is based on information on electrical quantities, such as voltage and current waveform, that are applied to the IGBT device, so that the IGBT temperature can be estimated.

Due to the delayed thermal response when the temperature is not measured directly at the semiconductor junction, the above methods for determining the temperature do not provide the required timely resolution and precision. Consequently, these techniques are not suitable for online measurement of the IGBT junction temperature, in particular, if the timely resolution should be at a frequency close to the control frequency of the IGBT device.

SUMMARY

An exemplary embodiment of the present disclosure provides a system for determining at least one of a junction temperature and a remaining lifetime of an IGBT device. The exemplary system includes a differential unit configured to receive a gate-emitter voltage characteristic of the IGBT device to be measured, and to differentiate the gate-emitter voltage characteristic to obtain pulses correlating with edges formed by a Miller plateau phase during a switch-off phase of the IGBT device. The exemplary system also includes a timer unit configured to measure a time delay between the obtained pulses indicating a start and end of the Miller plateau phase during the switch-off phase of the IGBT device, and a junction temperature calculation unit configured to determine at least one of the junction temperature and the remaining lifetime of the IGBT device based on the measured time delay.

An exemplary embodiment of the present disclosure provides a method for determining at least one of a junction temperature and a remaining lifetime of an IGBT device. The exemplary method includes differentiating a gate-emitter voltage characteristic to obtain pulses correlating with edges formed by a Miller plateau phase during a switch-off phase of the IGBT device. The exemplary method also includes measuring a time delay between the obtained pulses indicating the start and end of the Miller plateau phase during the switch-off phase of the IGBT device. In addition, the exemplary method includes determining at least one of the junction temperature and the remaining lifetime of the IGBT device based on the measured time delay.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
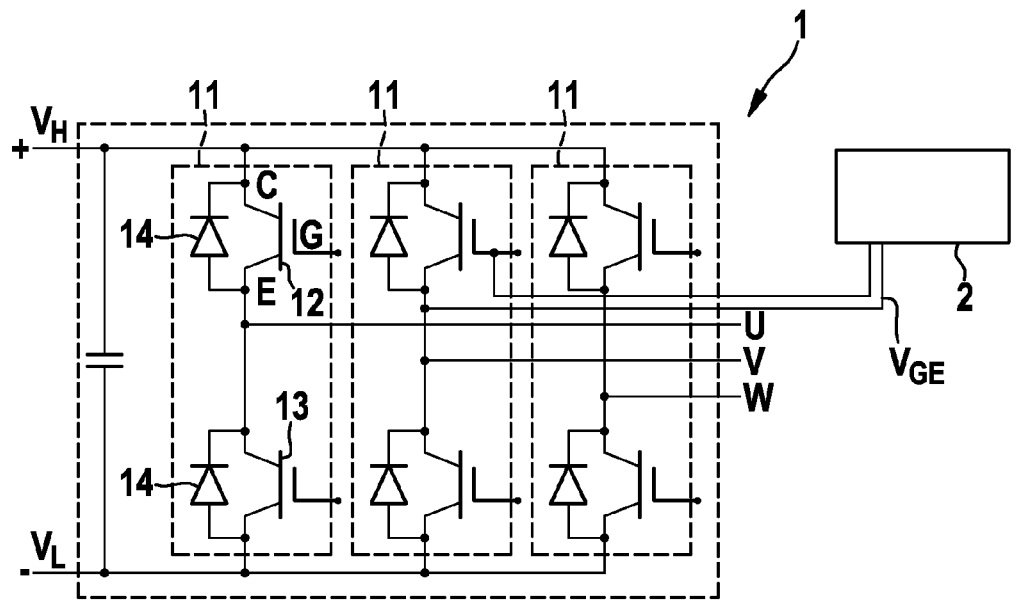
FIG. 1 shows a schematic of an IGBT driving module controlled by a control unit, according to an exemplary embodiment of the present disclosure.

Exemplary embodiments of the present disclosure provide a system and a method for determining a junction temperature of an IGBT device that provides an indication of the temperature with high precision and in high timely resolution.

Exemplary embodiments of the present disclosure provide a system and a method for determining at least one of a junction temperature and a remaining lifetime of an IGBT device.

Additional features of the present disclosure are explained in more detail below with reference to exemplary embodiments illustrated in the drawings.

An exemplary embodiment of the present disclosure provides a system for determining at least one of a junction temperature and a remaining lifetime of an IGBT device. The system includes a differential unit configured to receive a gate-emitter voltage characteristic of the IGBT device to be measured and to differentiate the gate-emitter voltage characteristic to obtain pulses correlating with edges formed by a Miller plateau phase during a switch-off phase of the IGBT device. The system also includes a timer unit configured to measure the time delay between the obtained pulses indicating the start and end of the Miller plateau phase during the switch-off phase of the IGBT device, and a junction temperature calculation unit configured to determine at least one of the junction temperature and the remaining lifetime of the IGBT device based on the measured time delay.

The behavior of an IGBT device strongly depends on its operating temperature. This is due to the strong interdependency between the temperature and fundamental physical parameters, such as mobility, lifetime and intrinsic carrier concentration. Since the fundamental physical parameters reflect standard semiconductor properties, the electrical characteristics of a semiconductor device are temperature-dependent. Apart from the temperature-sensitive electrical parameters, such as threshold voltage, turn-on and turn-off delay times, switching losses and the like, that require complex measurement techniques, it was found that, for example, the switch-off characteristics of the IGBT device at a given load condition can be used to determine the junction temperature of the device in a precise manner. According to an exemplary embodiment, the gate-emitter voltage characteristics during switching-off show a stepped pattern due to the discharge of a body capacitance having two steps, wherein a time delay between the first falling edge and a second falling edge determines a duration strongly depending on the device junction temperature. The stepped pattern forms plateau-like characteristics, also referred to as a Miller plateau.

Furthermore, it was found that the time delay is a close-to-linear function of the IGBT junction temperature. Hence, it is provided that a switch-off characteristic of the gate-emitter voltage of the IGBT device is analyzed in order to determine the IGBT junction temperature.

The evaluation of the duration of the Miller plateau allows a precise determination of the junction temperature at each switching of the IGBT device. Hence, an online temperature characteristic of an IGBT device can be obtained which, for example, allows for a more precise estimation of the thermal stress exerted on the IGBT device and of the remaining lifetime thereof.

Furthermore, the junction temperature calculation unit may be configured to determine the junction temperature of the IGBT device based on the measured time delay and on a collector-emitter voltage of the IGBT device and an IGBT device current.

In accordance with an exemplary embodiment, the junction temperature calculation unit may be configured to determine the junction temperature and/or the remaining lifetime of the IGBT device by means of a given look-up table and/or a given mathematical function.

According to an exemplary embodiment, the system can include a signal amplitude detection unit and a comparator unit configured to select the pulses indicating the start and end of the Miller plateau phase during the switch-off phase of the IGBT device from other pulses. The comparator unit is configured to filter pulses based on a reference switch voltage as a threshold level. The signal amplitude detection unit is configured to generate the respective threshold levels based on the amplitudes of the pulses generated in the differential unit.

According to an exemplary embodiment, the system can include a signal amplitude detection unit and a comparator unit configured to select the pulses indicating the start and end of the Miller plateau phase during the switch-off phase of the IGBT device from other pulses. The comparator unit is configured to compare voltage levels of pulses with a respective reference switch voltage as a threshold level to obtain binary pulse signals. The signal amplitude detection unit is configured to generate the respective threshold levels based on the amplitudes of the pulses generated in the differential unit.

Furthermore, the comparator unit may be configured to apply a hysteresis when comparing the voltage levels of pulses with the respective reference switch voltage as a threshold level to obtain the binary pulse signals.

An exemplary embodiment of the present disclosure provides a method for determining at least one of a junction temperature and a remaining lifetime of an IGBT device. The method includes the steps of differentiating a gate-emitter voltage characteristic to obtain pulses correlating with edges formed by a Miller plateau phase during a switch-off phase of the IGBT device, measuring the time delay between the obtained pulses indicating the start and end of the Miller plateau phase during the switch-off phase of the IGBT device, and determining the junction temperature and/or the remaining lifetime of the IGBT device based on the measured time delay.

According to an exemplary embodiment, the junction temperature of the IGBT device may further be determined based on a collector-emitter voltage and an IGBT device current.

FIG. 1 shows a schematic of an IGBT driver module 1 for providing a three-phase output generated from a DC supply source applied between a high supply potential VH and a low supply potential VL, according to an exemplary embodiment of the present disclosure. The IGBT driver module 1 is controlled by a control unit 2. The IGBT driver module 1 includes a B6 circuit which has three half-bridges 11, one for each output phase U, V, W.

Each half-bridge 11 is a serial connection of two IGBT devices between the high supply potential VH and the low supply potential VL. In each of the half-bridges 11 a collector terminal C of a first IGBT device 12 is connected to the high supply potential VH, while an emitter terminal E of the first IGBT device 12 is connected to an output node for the respective output phase U, V, W. A collector terminal C of a second IGBT device 13 is connected to the output node and the emitter terminal E of the first IGBT device 12, while a collector terminal C of the second IGBT device 13 is connected to a low supply potential VL.

Each IGBT device 12, 13 of each half-bridge 11 is provided with a free-wheeling diode 14 that is connected between the high supply potential VH and the low supply potential VL in a reverse direction. Gate terminals G of all IGBT devices 12, 13 are controlled by the control unit 2, which is not shown in FIG. 1 for sake of clarity. For example, the IGBT driver module 1 is used to energize a three-phase synchronous electrical machine by applying pulse width-modulated signals to the IGBT devices 12, 13 according to a given commutation scheme.

Particularly for high power applications, monitoring of the temperature of the IGBT driver module 1 and the IGBT devices 12, 13 becomes important in order to prevent failure. To measure the junction temperature of an IGBT device 12, 13, the electrical switch-off behavior of an IGBT device 12, 13 is used, which depends on the junction temperature of the respective IGBT device 12, 13.

Figure 2:
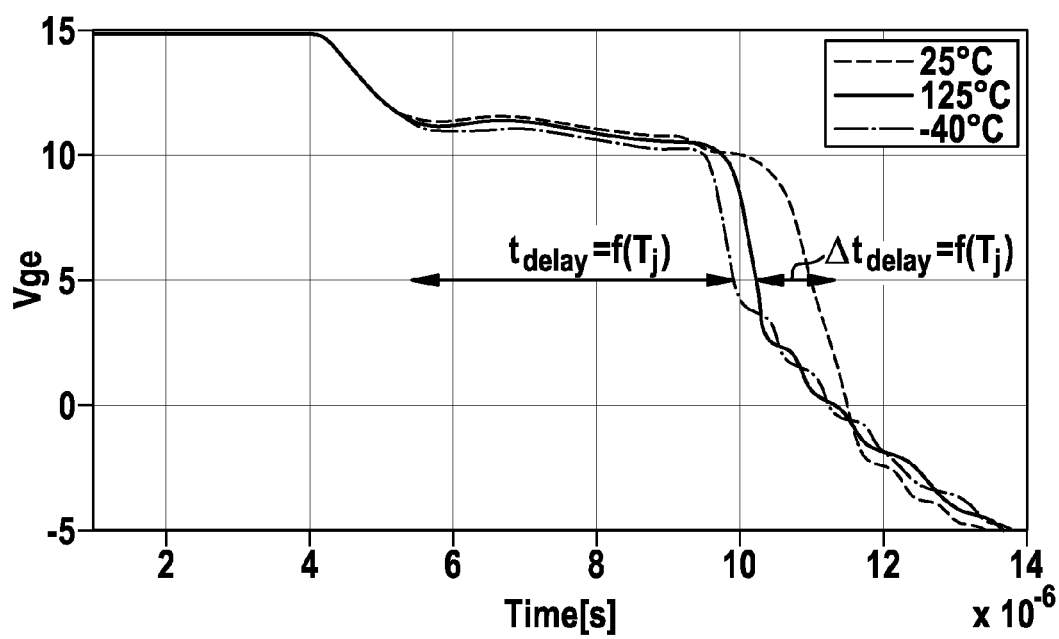
FIG. 2 shows a diagram depicting the gate-emitter voltage of an IGBT device over time during a switch-off phase, according to an exemplary embodiment of the present disclosure.
Figure 3:
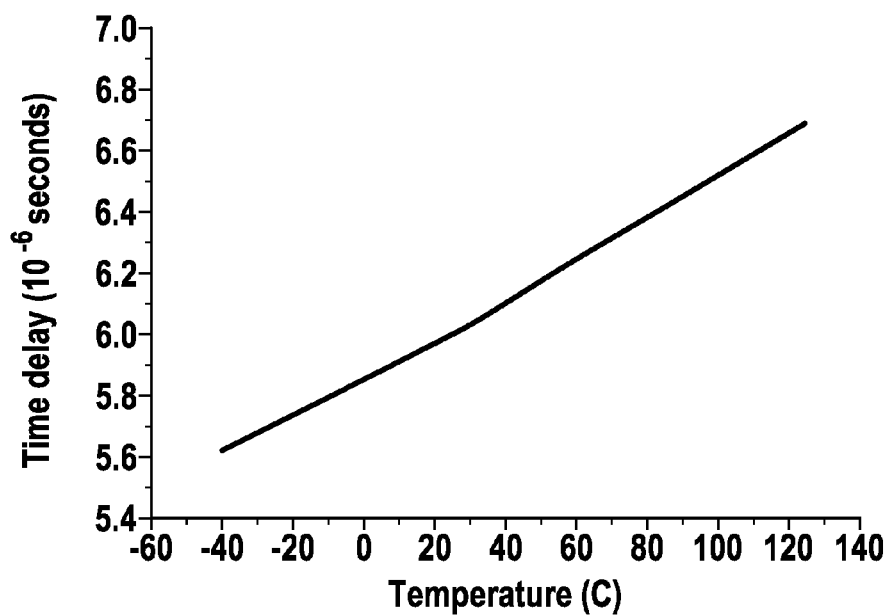
FIG. 3 shows a diagram depicting the time delay of the Miller plateau over the junction temperature of the IGBT device, according to an exemplary embodiment of the present disclosure.
Figure 4:
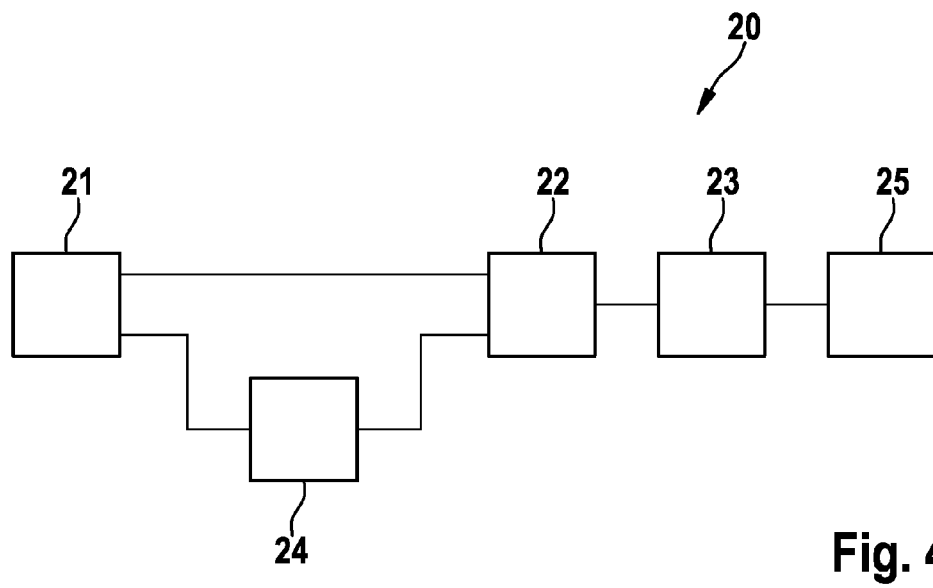
FIG. 4 shows a functional block diagram for determining the time delay of the Miller plateau, according to an exemplary embodiment of the present disclosure.

As can be seen in FIG. 2, which shows a diagram of the characteristics of the gate-emitter voltage of an IGBT device 12, 13 during a switch-off phase according to an exemplary embodiment of the present disclosure, the decrease of the gate-emitter voltage includes two steps defining an intermediate voltage plateau which is referred to as a Miller plateau. The duration tdelay of the Miller plateau is temperature-dependent. It has been observed that the interdependency of the time delay tdelay of the Miller plateau and the junction temperature of the IGBT device 12, 13 is close to linear, as can be seen in the diagram of FIG. 3.

To obtain an indication of the junction temperature based on the knowledge of the above electrical behavior of a switched-off IGBT device 12, 13, a temperature determining unit 20 may be included in the control unit 2.

The temperature determining unit includes a differential unit 21, which derives the gate-emitter voltage UGE of a selected IGBT device 12, 13 of the IGBT driver module 1 in a timely manner. The differential unit 21 receives the gate-emitter voltage UGE of the selected IGBT device 12, 13 and provides a pulse for each edge of the gate-emitter voltage characteristics. The differential unit 21 can be provided as a high pass filter filtering the DC portion of the gate-emitter voltage. The differential unit 21 may include a capacitor and resistance network generating the differential transformation of the stepped gate-emitter voltage UGE during a switch-off phase of the IGBT device 12, 13.

The edges of the gate-emitter voltage UGE generate a pulse, the amplitude of which is dependent on the rise time of the gate-emitter voltage UGE. The time difference between the so generated pulses represents the time delay tdelay of the Miller plateau that represents the junction temperature T to be determined. The differentiated gate-emitter voltage UGE is provided to a comparator unit 22 in order to correctly transfer the pulses of the differential unit 21 to a downstream timer unit 23 in a digital form.

The comparator unit 22 has a small hysteresis, wherein the reference switch voltage for the comparator unit 22 is set to the half of the pulse amplitude of the differential unit 21. Since the pulse amplitude of the differentiated gate-emitter voltage UGE is depending on the rise time, the pulse amplitude will change with many parameters.

For this reason, a variable reference voltage is generated in a signal amplitude detector unit 24 dependent on the output amplitude of the differential unit 21. The signal amplitude detector unit 24 is used to set a correct reference switch voltage to the comparator unit 22 which is configured to both of the edges defining the Miller plateau duration tdelay. The signal amplitude detector unit 24 measures the negative amplitude of the pulse supplied by the differential unit 21. The output voltage of the signal amplitude detector unit 24 indicating the value of the negative amplitude of the output signal of the differential unit 21 is divided by two (e.g., by means of a voltage divider) and forwarded to the comparator unit 22 as reference switch voltage.

The timer unit 23 is configured to measure the time delay between the first and second pulse occurring during the switch-off period.

Figure 5:
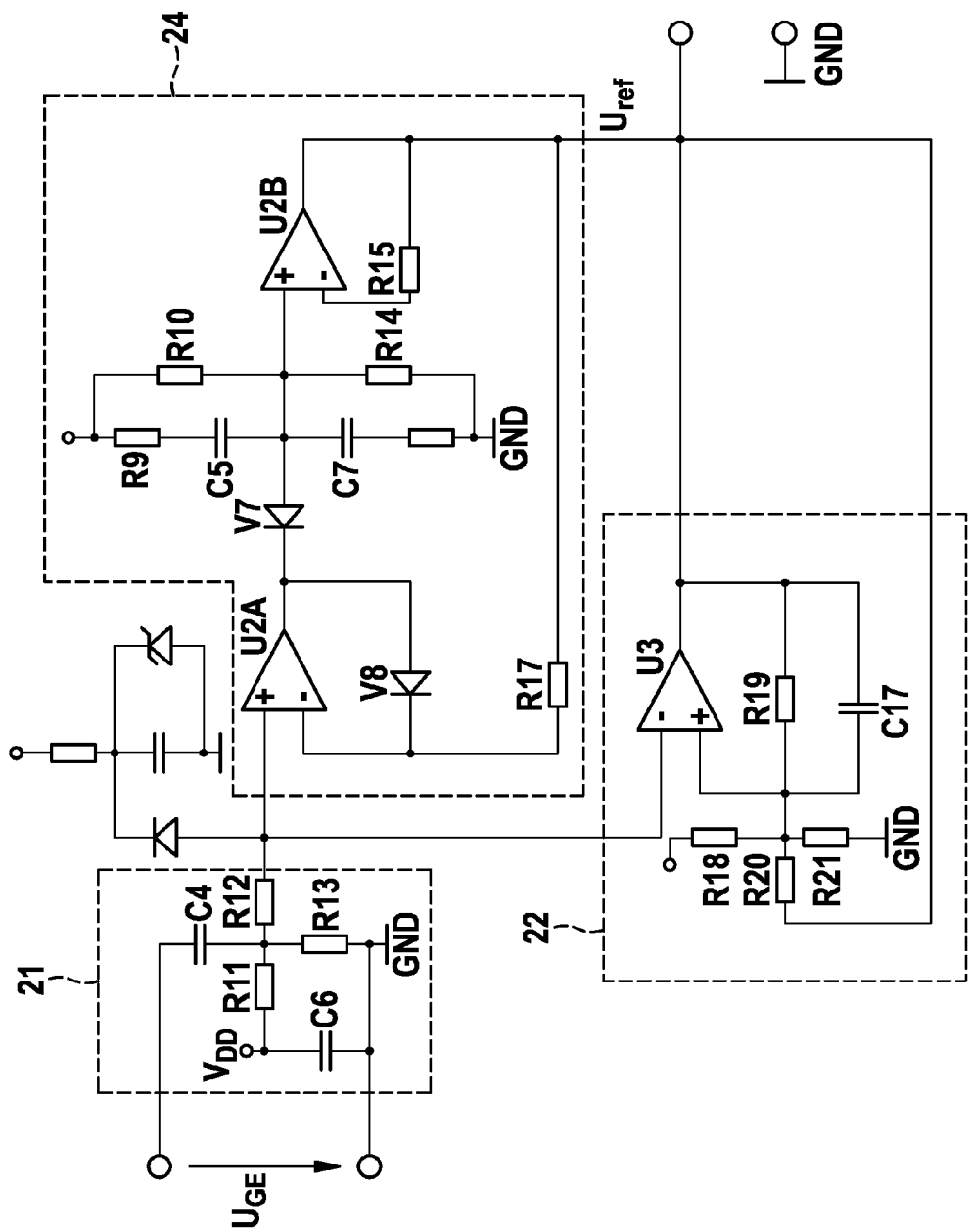
FIG. 5 shows a schematic of an example of the temperature determining unit, according to an exemplary embodiment of the present disclosure.

In FIG. 5, a schematic of an exemplary embodiment of the temperature determining unit 20 is shown. In the differential unit 21, a capacitor C4 is provided which performs the differentiation of the gate-emitter voltage. The resistors R11 and R13 represent the output load for C4. The circuit internal zero is set to half supply voltage VDD using a voltage divider including the resistors R11 and R13. The capacitor C6 is used to connect the resistor R11 HF right to ground GND. The resistor R12 limits the output current of the differential unit 21.

The comparator unit 22 uses an operational amplifier U3. The input signal from the differential unit 21 goes to the negative input of the operational amplifier U3, and hence it is inverted as the output. The reference switch voltage Uref is connected to the positive input of U3 through the resistor R20. The resistors R18, R19, R20, and R21 each represent a voltage divider for the reference switch voltage. Thus, the reference switch voltage Uref is nearly half of the output of the signal amplitude detector unit 23. The resistors R18 and R21 set the working voltage to half of the supply voltage VDD. The resistor R19 is included to provide the necessary hysteresis. The capacitor C17 helps to speed up the switching of the output of the comparator unit 22.

The signal amplitude detection unit 23 uses an operational amplifier U2A. The amplifier U2A with the diode V7 and the output buffer U2B represents a negative peak detector. The amplifier U2A drives the diode V7 negative as long as the voltage of the output buffer U2B is not equal to the value of the input voltage. As soon as the input voltage goes positive, the diode V7 disconnects the output of the amplifier U2A from the capacitors C5 and C6. At this point, the maximum negative value is stored in the capacitors C5 and C7. This buffered voltage is divided by two and forwarded as reference switch voltage Uref to the comparator unit 22. Without a signal, the capacitances C5 and C7 would be discharged to 2.5 V over the resistors R10 and R14. The discharge time constant can be set by the capacitances C5, C7 and resistances R10, R14. The diode V8 prevents the saturation of the amplifier U2A in the store state.

Figure 6:
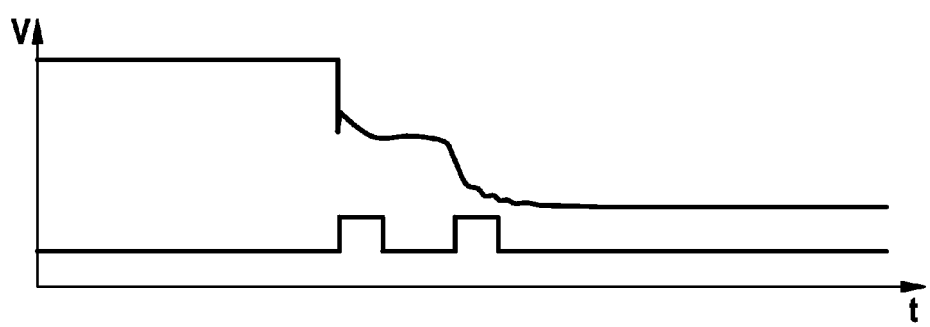
FIG. 6 shows the characteristics of the gate-emitter voltage of the measured IGBT device in relation to the pulses generated as the output of the comparator unit, according to an exemplary embodiment of the present disclosure.

As can be seen in the exemplary embodiment of FIG. 6, the characteristic of the gate-emitter voltage UGE of the measured IGBT device 12, 13 is illustrated in relation to the pulses generated as the output of the comparator unit 22. It can be clearly seen that the first pulse is generated at the beginning of the Miller plateau and the second pulse is generated after the second decay of the gate-emitter voltage VGE of the Miller plateau which is temperature-dependent. The time shift between these two pulses varies with temperature.

The time delay tdelay between the two pulsing edges of the pulses generated in the comparator unit 22 is measured by the timer unit 23 in order to obtain an indication of the time delay tdelay of the Miller plateau. The indication of the time delay tdelay of the Miller plateau is forwarded to a junction temperature calculating unit 25 which substantially includes a given look-up table or a given comparable function in order to determine an indication of the junction temperature T and/or an indication about a remaining lifetime depending on the indication of the time delay tdelay of the Miller plateau.

The DC link voltage or the collector-emitter voltage UGE over the IGBT device 12, 13 and the current through the IGBT device 12, 13 are used to obtain the referencing junction temperature indication from the given look-up table as the time delay tdelay also depend on these measures. Information on the collector-emitter voltage UGE and the IGBT device 12, 13 current is usually available in the control unit 2 as the operation of the IGBT driver module 1 is controlled depending on these measures. For instance, for performing the above mentioned commutation scheme, the DC link voltage or the collector-emitter voltage UGE over the IGBT devices 12, 13 and the current through the IGBT devices 12, 13 are required. The junction temperature determination device 20 may be provided for each IGBT device 12, 13 in the control unit 2.

One additional advantage of the above method for determining the junction temperature T of an IGBT device is that ageing effects of the module, in which the IGBT device is implemented, can be easily detected if a consistent increase of the average junction temperature is recorded. When a pattern of a consistent increase of the junction temperature T is detected, the reason can be attributed to the ageing of the solder between the IGBT substrates and the module base plate or even debonding of the vias connecting their chips to the terminals of the IGBT driver module 1. These ageing processes translate into an increased thermal resistance of the package, which means that the IGBT chips are less efficiently cooled. Thus, the estimated junction temperature of the IGBT devices 12, 13 will increase gradually over time.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 IGBT driver module
2 control unit
11 half-bridge
12 first IGBT device
13 second IGBT device
14 free-wheeling diode
21 differential unit
22 comparator unit
23 timer unit
24 signal amplitude detector unit
25 junction temperature calculation unit
U, V, W output phases
C collector terminal
G gate terminal
E emitter terminal
Tj junction temperature
VH, VL high, low supply potential
VGE gate-emitter-voltage
tdelay time delay
Uref reference switch voltage

What is claimed is:

1. A system for determining at least one of a junction temperature and a remaining lifetime of an IGBT device, comprising:
 a differential unit configured to receive a gate-emitter voltage characteristic of the IGBT device to be measured, and to differentiate the gate-emitter voltage characteristic to obtain pulses correlating with edges formed by a Miller plateau phase during a switch-off phase of the IGBT device;
 a timer unit configured to measure a time delay between the obtained pulses indicating a start and end of the Miller plateau phase during the switch-off phase of the IGBT device; and
 a junction temperature calculation unit configured to determine at least one of the junction temperature and the remaining lifetime of the IGBT device based on the measured time delay.

2. The system according to claim 1, comprising:
 a signal amplitude detector unit and a comparator unit configured to select the pulses indicating the start and end of the Miller plateau phase during the switch-off phase of the IGBT device from other pulses,
 wherein the comparator unit is configured to filter pulses based on a reference switch voltage as a threshold level, and
 wherein the signal amplitude detection unit is configured to generate the respective threshold levels based on the amplitudes of the pulses obtained in the differential unit.

3. The system according to claim 1, comprising:
 a signal amplitude detector unit and a comparator unit configured to select the pulses indicating the start and end of the Miller plateau phase during the switch-off phase of the IGBT device from other pulses,
 wherein the comparator unit is configured to compare voltage levels of pulses with a respective reference switch voltage as a threshold level to obtain binary pulse signals, and
 wherein the signal amplitude detector unit is configured to generate the respective threshold levels based on the amplitudes of the pulses obtained in the differential unit.

4. The system according to claim 3, wherein the comparator unit is configured to apply a hysteresis when comparing the voltage levels of pulses with the respective reference switch voltage as a threshold level to obtain the binary pulse signals.

5. The system according to claim 1, wherein the junction temperature calculation unit is configured to determine the junction temperature of the IGBT device based on the measured time delay and on a collector-emitter voltage of the IGBT device and an IGBT device current.

6. The system according to claim 5, comprising:
 a signal amplitude detector unit and a comparator unit configured to select the pulses indicating the start and end of the Miller plateau phase during the switch-off phase of the IGBT device from other pulses,
 wherein the comparator unit is configured to filter pulses based on a reference switch voltage as a threshold level, and
 wherein the signal amplitude detection unit is configured to generate the respective threshold levels based on the amplitudes of the pulses obtained in the differential unit.

7. The system according to claim 5, comprising:
 a signal amplitude detector unit and a comparator unit configured to select the pulses indicating the start and end of the Miller plateau phase during the switch-off phase of the IGBT device from other pulses,
 wherein the comparator unit is configured to compare voltage levels of pulses with a respective reference switch voltage as a threshold level to obtain binary pulse signals, and
 wherein the signal amplitude detector unit is configured to generate the respective threshold levels based on the amplitudes of the pulses obtained in the differential unit.

8. The system according to claim 7, wherein the comparator unit is configured to apply a hysteresis when comparing the voltage levels of pulses with the respective reference switch voltage as a threshold level to obtain the binary pulse signals.

9. The system according to claim 5, wherein the junction temperature calculation unit is configured to determine at least one of the junction temperature of the IGBT device and an indication of the remaining lifetime by means of at least one of a look-up table and a mathematical function.

10. The system according to claim 9, comprising:
 a signal amplitude detector unit and a comparator unit configured to select the pulses indicating the start and end of the Miller plateau phase during the switch-off phase of the IGBT device from other pulses,
 wherein the comparator unit is configured to filter pulses based on a reference switch voltage as a threshold level, and
 wherein the signal amplitude detection unit is configured to generate the respective threshold levels based on the amplitudes of the pulses obtained in the differential unit.

11. The system according to claim 9, comprising:
 a signal amplitude detector unit and a comparator unit configured to select the pulses indicating the start and end of the Miller plateau phase during the switch-off phase of the IGBT device from other pulses, wherein the comparator unit is configured to compare voltage levels of pulses with a respective reference switch voltage as a threshold level to obtain binary pulse signals, and wherein the signal amplitude detector unit is configured to generate the respective threshold levels based on the amplitudes of the pulses obtained in the differential unit.

12. The system according to claim 11, wherein the comparator unit is configured to apply a hysteresis when comparing the voltage levels of pulses with the respective reference switch voltage as a threshold level to obtain the binary pulse signals.

13. A method for determining at least one of a junction temperature and a remaining lifetime of an IGBT device, the method comprising:

differentiating a gate-emitter voltage characteristic to obtain pulses correlating with edges formed by a Miller plateau phase during a switch-off phase of the IGBT device;

measuring a time delay between the obtained pulses indicating the start and end of the Miller plateau phase during the switch-off phase of the IGBT device; and determining at least one of the junction temperature and the remaining lifetime of the IGBT device based on the measured time delay.

14. The method according to claim 13, wherein the junction temperature of the IGBT device is further determined based on a collector-emitter voltage and an IGBT device current.

15. The method according to claim 13, wherein at least one of the junction temperature of the IGBT device and an indication of the remaining lifetime is determined by means of at least one of a look-up table and a mathematical function.

16. The method according to claim 13, comprising:

selecting the pulses indicating the start and end of the Miller plateau phase during the switch-off phase of the IGBT device from other pulses, wherein the selecting of the pulses comprises:

filtering pulses based on a reference switch voltage as a threshold level, and generating the respective threshold levels based on the amplitudes of the obtained pulses.

17. The method according to claim 13, comprising:

selecting the pulses indicating the start and end of the Miller plateau phase during the switch-off phase of the IGBT device from other pulses, wherein the selecting of the pulses comprises:

comparing voltage levels of pulses with a respective reference switch voltage as a threshold level to obtain binary pulse signals; and generating the respective threshold levels based on the amplitudes of the obtained pulses.

18. The method according to claim 17, comprising:

applying a hysteresis when comparing the voltage levels of pulses with the respective reference switch voltage as a threshold level to obtain the binary pulse signals.

* * * * *